United States Patent
West et al.

(10) Patent No.: US 10,828,797 B2
(45) Date of Patent: Nov. 10, 2020

(54) METHOD OF PATTERNING ELECTRICALLY-CONDUCTIVE FILM ON A FLEXIBLE SUBSTRATE

(71) Applicants: John West, Hartville, OH (US); Da-Wei Lee, Kent, OH (US); Paul Anders Olson, Kent, OH (US)

(72) Inventors: John West, Hartville, OH (US); Da-Wei Lee, Kent, OH (US); Paul Anders Olson, Kent, OH (US)

(73) Assignee: KENTA STATE UNIVERSITY, Kent, OH (US)

( * ) Notice: Subject to any disclaimer, the term of this patent is extended or adjusted under 35 U.S.C. 154(b) by 907 days.

(21) Appl. No.: 15/109,191

(22) PCT Filed: Dec. 30, 2014

(86) PCT No.: PCT/US2014/072751
§ 371 (c)(1),
(2) Date: Jun. 30, 2016

(87) PCT Pub. No.: WO2015/103265
PCT Pub. Date: Jul. 9, 2015

(65) Prior Publication Data
US 2016/0325457 A1 Nov. 10, 2016

Related U.S. Application Data

(60) Provisional application No. 61/921,696, filed on Dec. 30, 2013.

(51) Int. Cl.
*H05K 3/02* (2006.01)
*H05K 3/10* (2006.01)
(Continued)

(52) U.S. Cl.
CPC ............... *B26F 3/00* (2013.01); *B26D 3/085* (2013.01); *B29C 53/04* (2013.01); *B29C 53/80* (2013.01);
(Continued)

(58) Field of Classification Search
CPC ......... B26F 3/00; B26D 3/085; B32B 43/006; B29C 53/04; B29C 53/80; H01L 31/1884
See application file for complete search history.

(56) References Cited

U.S. PATENT DOCUMENTS

| 8,449,949 B2 * | 5/2013 | Lee ..................... B32B 27/08 427/554 |
| 9,233,481 B2 * | 1/2016 | West ..................... B26F 3/00 |

(Continued)

*Primary Examiner* — Paul D Kim
(74) *Attorney, Agent, or Firm* — Renner Kenner Greive Bobak Taylor & Weber (57) ABSTRACT

A method of patterning a combined layer of an electrically-conductive film, such as indium-tin-oxide (ITO), that is disposed on a flexible substrate includes bending the combined layer about a radius of curvature. The combined layer is initially bent in a first direction so that the electrically-conducive film is distal to the radius of curvature, so as to form initial dielectric lines in the electrically-conductive film. The combined layer is then bent in another direction so that the electrically-conductive film is proximate to the radius of curvature to further enhance the dielectric performance of the initial dielectric lines. The dielectric lines electrically isolate a portion of the electrically-conductive film that is disposed therebetween, to form an electrically conductive electrode.

9 Claims, 5 Drawing Sheets

(51) Int. Cl.
*B26F 3/00* (2006.01)
*B26D 3/08* (2006.01)
*B29C 53/80* (2006.01)
*B29C 53/04* (2006.01)
*H01L 31/18* (2006.01)
*B32B 43/00* (2006.01)

(52) U.S. Cl.
CPC ........ *B32B 43/006* (2013.01); *H01L 31/1884* (2013.01); *Y02E 10/50* (2013.01)

(56) References Cited

U.S. PATENT DOCUMENTS

| | | | | |
|---|---|---|---|---|
| 2002/0062915 | A1* | 5/2002 | Matsumoto | B29D 11/00269 156/245 |
| 2007/0080627 | A1* | 4/2007 | Sakamoto | H01L 51/5237 313/504 |
| 2009/0087629 | A1* | 4/2009 | Everaerts | B32B 7/12 428/203 |
| 2010/0247810 | A1* | 9/2010 | Yukinobu | H01B 1/08 428/1.4 |
| 2010/0323186 | A1* | 12/2010 | Maruyama | H01B 1/04 428/323 |
| 2011/0209901 | A1* | 9/2011 | MacDonald | C08J 7/04 174/254 |
| 2011/0227245 | A1* | 9/2011 | Swanson | B05D 3/12 264/134 |

* cited by examiner

METHOD OF PATTERNING ELECTRICALLY-CONDUCTIVE FILM ON A FLEXIBLE SUBSTRATE

CROSS-REFERENCE TO RELATED APPLICATION

This application claims the benefit of U.S. Provisional Application No. 61/921,696 filed on Dec. 30, 2013, the content of which is incorporated herein by reference.

TECHNICAL FIELD

Generally, the present invention relates to methods of forming electrically-conductive electrodes. Particularly, the present invention relates to methods of forming electrically-conductive electrodes on flexible substrates. More particularly, the present invention relates to methods of forming patterned electrodes by controlling the cracking of a layer of electrically-conductive film, such as indium-tin-oxide (ITO), that is disposed on a flexible substrate.

BACKGROUND OF THE INVENTION

Flat panel devices, such as flat-panel displays, including LC (liquid crystal) and plasma displays, and photovoltaic devices, utilize transparent, conductive electrodes to control various operating functions of the flat panel device. During fabrication of the flat panel device, the transparent, conductive electrodes are typically formed of a thin film of transparent, electrically-conductive material, such as indium-tin-oxide (ITO), which is vacuum-deposited on a transparent rigid glass substrate. The ITO film is patterned into optically-transparent electrodes using conventional photolithographic techniques. Such photolithographic techniques, however, require precise and accurate bonding of the electrodes to the driving circuitry of the display, which can be costly. Recently, however, the flat-panel device industry has sought to replace the use of rigid glass substrates with flexible substrates, such as those formed from flexible plastics and polymers, while still retaining the use of ITO, or other electrically-conductive polymers, to form the transparent electrodes using advanced printing and photolithographic techniques.

In addition, while indium-tin-oxide (ITO) has the desired optical and electrical properties required for such flat panel devices, ITO is brittle and is easily cracked when a flexible substrate upon which the ITO film is carried is bent or flexed. As such, flat panel electronic devices utilizing ITO tend to be fragile and require careful handling, and in some instances, cracking of the ITO film may result in reduced production yields of such flat panel electronic devices. In contrast, electrically-conductive polymers, which are an alternative to ITO, have the advantage of being more flexible than ITO and are able to be used in manufacturing processes of electronic devices that utilize printing and photolithographic techniques. However, as compared to ITO, electrically-conductive polymers have a variety of drawbacks, including reduced electrical conductivity and reduced light transmission.

Therefore, there is a need for a low-cost method of patterning an electrically-conductive film, such as indium-tin-oxide (ITO), into conductive electrodes on a flexible substrate. In addition, there is a need for a method of patterning an electrically-conductive film, such as indium-tin-oxide (ITO), into conductive electrodes on a flexible substrate, which is compatible with continuous roll-to-roll manufacturing processes. Furthermore, there is a need for a method of patterning an electrically conductive film, such as indium-tin-oxide (ITO), into conductive electrodes that are precisely defined. In addition, there is a need for a method of patterning an electrically-conductive film, such as indium-tin-oxide (ITO), that is disposed on flexible substrates that is simple to execute and that eliminates the need for costly and environmentally-unfriendly materials and solvents.

SUMMARY OF THE INVENTION

In light of the foregoing, it is a first aspect of the present invention to provide a method of patterning a film comprising the steps of providing a flexible substrate having a electrically conductive film disposed thereon to form a combined layer; bending the combined layer about a radius of curvature to crack the electrically conductive film to form a plurality of dielectric lines in the electrically conductive film, such that each pair of consecutive dielectric lines defines and electrically isolates a conductive electrode therebetween.

It is another aspect of the present invention to provide a method of patterning a conductive film comprising, providing a flexible substrate having an electrically-conductive film disposed thereon to form a combined layer, bending the flexible substrate about a radius of curvature, moving the radius of curvature along the combined layer to form a plurality of dielectric crack lines in the conductive film, wherein each pair of the plurality of dielectric crack lines defines and electrically isolates a conductive section therebetween; inversely bending the flexible substrate about a radius of curvature, and moving the radius of curvature along the combined layer to form a plurality of dielectric crack lines in the conductive film, wherein each pair of the plurality of dielectric crack lines defines and electrically isolates a conductive section therebetween.

Another aspect of the present invention is to provide a method of patterning a conductive film comprising, providing a flexible substrate having an electrically-conductive film disposed thereon, and having an adhesive film disposed thereon, to form a combined layer, bending the flexible substrate about a radius of curvature, moving the radius of curvature along the combined layer to form a plurality of dielectric crack lines in the conductive film, wherein each pair of the plurality of dielectric crack lines defines and electrically isolates a conductive section therebetween, inversely bending the flexible substrate about a radius of curvature, moving the radius of curvature along the combined layer to form a plurality of dielectric crack lines in the conductive film, and detaching the adhesive film, wherein each pair of the plurality of dielectric crack lines defines and electrically isolates a conductive section therebetween.

An additional aspect of the present invention is to provide a method of patterning a conductive film comprising, providing a flexible substrate having an electrically-conductive film disposed thereon, so as to form a combined layer, providing first and second substantially parallel plates that are spaced apart by a gap, attaching a portion of the substrate to each first and second plate, such that the combined layer is bent across the gap with a radius of curvature, and sliding one of the first and second plates relative to the other, so as to bend the combined layer by the radius of curvature, so as to form a plurality of dielectric crack lines in the conductive film, whereby each pair of the plurality of dielectric crack lines defines and electrically isolates a conductive section therebetween, inversely attaching a portion of the substrate to each first and second plate, such that the combined layer is inversely bent across the gap with a radius of curvature, and sliding one of the first and second plates relative to the other, so as to inversely bend the combined layer by the radius of curvature, so as to form a plurality of dielectric crack lines in the conductive film, whereby each pair of the plurality of dielectric crack lines defines and electrically isolates a conductive section therebetween.

Still another aspect of the present invention is to provide a method of patterning a conductive film comprising, providing a flexible substrate having an electrically-conductive film disposed thereon, and having an adhesive film disposed thereon, to form a combined layer, providing first and second substantially parallel plates that are spaced apart by a gap, attaching a portion of the substrate to each first and second plate, such that the combined layer is bent across the gap with a radius of curvature, and sliding one of the first and second plates relative to the other, so as to bend the combined layer by the radius of curvature, so as to form a plurality of dielectric crack lines in the conductive film, whereby each pair of the plurality of dielectric crack lines defines and electrically isolates a conductive section therebetween, inversely attaching a portion of the substrate to each first and second plate, such that the combined layer is inversely bent across the gap with a radius of curvature, sliding one of the first and second plates relative to the other, so as to inversely bend the combined layer by the radius of curvature, and detaching the adhesive film, so as to form at plurality of dielectric crack lines in the conductive film, whereby each pair of the plurality of dielectric crack lines defines and electrically isolates a conductive section therebetween.

BRIEF DESCRIPTION OF THE DRAWINGS

These and other features and advantages of the present invention will become better understood with regard to the following description, appended claims, and accompanying drawings wherein:

DETAILED DESCRIPTION OF THE INVENTION

Figure 1A:
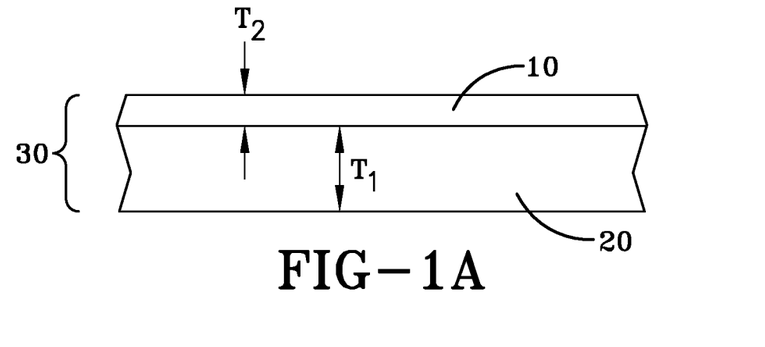
FIG. 1A is an elevational view showing a combined layer formed of a PET substrate and indium-tin-oxide (ITO) film disposed thereon in accordance with the concepts of the present invention.

A method of patterning an electrically-conductive film that is disposed on a flexible substrate to form electrically-conductive electrodes is provided by the present invention. In particular, a thin conductive film 10, which may comprise indium-tin-oxide (ITO) or other suitable electrically conductive material, is applied upon a flexible substrate 20 to form a combined layer 30, as shown in FIG. 1A. It should be appreciated that the conductive film 10 may be at least partially transparent to light. In addition, the flexible substrate 20 may comprise polyethylene terephthalate (PET), as well as any other suitably flexible material, such as plastic, or any other polymeric/elastomeric material for example. It should be appreciated that the flexible substrate may be at least partially transparent to light. The ITO film 10 may be applied or otherwise disposed on the flexible substrate 20 using any suitable process, such as sputtering or vacuum deposition for example. Once the ITO film 10 is disposed on the flexible substrate 20, a stress force is applied to the combined layer 30 to crack the ITO film 10 into electrically isolated conductive sections. Specifically, the ability to crack the ITO film 10 is a result of its brittleness (i.e., inability to sustain a change in dimension without breaking) and the ability of the substrate 20 to be flexed.

In order to "crack" or fracture the electrically-conductive ITO film 10 in order to pattern it with non-conductive dielectric lines, stress is imparted to the ITO film 10 by either mechanical flexing/bending alone, or in combination with the application of thermal stress. Mechanical flexing is achieved by bending the combined layer 30 in a manner to be discussed, whereby the radius of curvature of the bend inversely controls the magnitude of the mechanical stress imparted to the substrate 20 and the ITO film 10. That is, the smaller the radius of curvature used to form the bend, the greater the amount of mechanical stress that is applied to the substrate 20 and to the ITO film 10. Alternatively, in the case of thermally heating the combined layer 30, the substrate 20 and the conductive ITO film 10 have different coefficients of thermal expansion, such that changes in temperature produce a mechanical strain that is used to produce dielectric crack lines or dielectric lines in the conductive ITO film 10.

Figure 1B:
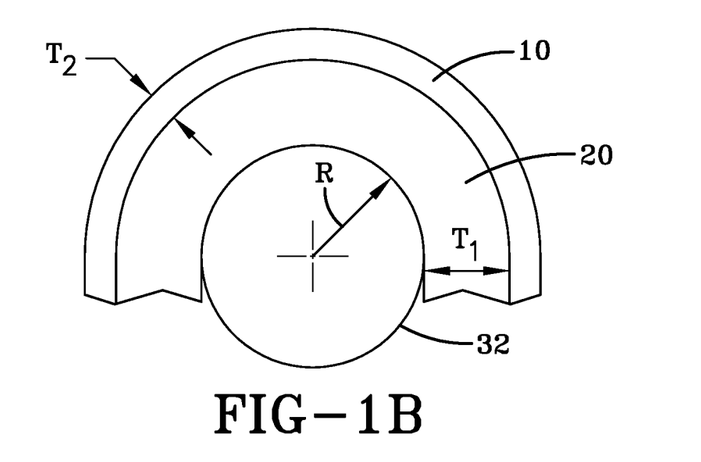
FIG. 1B is an elevational view showing the combined PET/ITO layer bent outwardly (i.e. the ITO film is disposed on the outside, so as to be distal to the radius of curvature R) around a radius of curvature R to form first or initial dielectric crack lines in the ITO film in accordance with the concepts of the present invention.
Figure 1C:
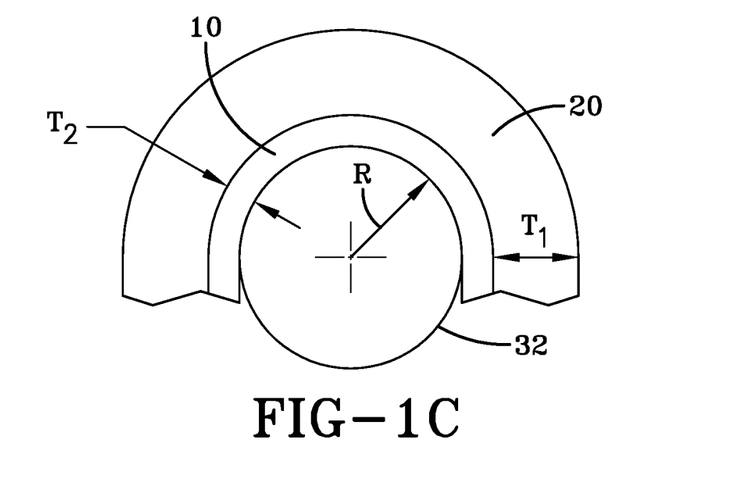
FIG. 1C is an elevational view showing the combined PET/ITO layer bent inwardly (i.e. the ITO film is disposed on the inside, so as to be proximate to the radius of curvature R) around a radius of curvature R to form enhanced dielectric crack lines in the ITO film in accordance with the concepts of the present invention.
Figure 2A:
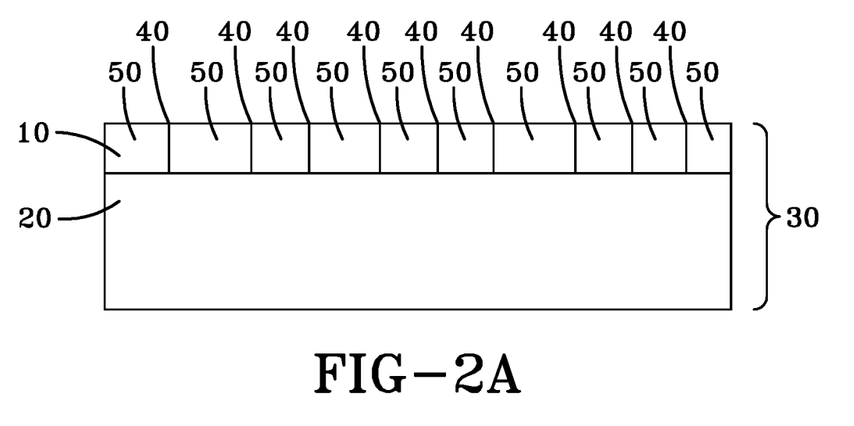
FIG. 2A is an elevational view showing first or initial dielectric crack lines that are formed in the ITO film after the combined PET/ITO layer has been bent outwardly in accordance with the concepts of the present invention; or the FIG. 2B is a schematic representation of a transmission optical microscope image of the combined PET/ITO layer that shows the first or initial dielectric crack lines formed in the ITO film in accordance with the concepts of the present invention.
Figure 2B:
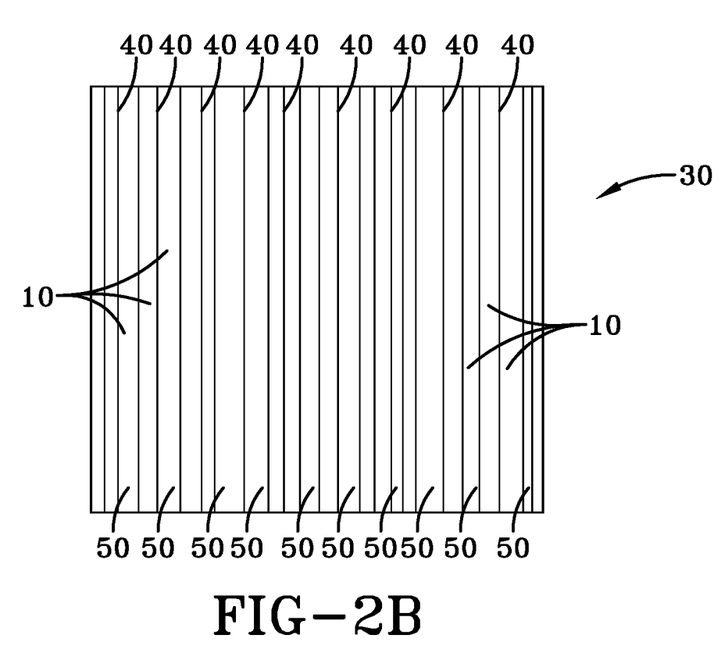

Specifically, in one embodiment, the patterning process is carried out, such that after the conductive film 10, such as ITO, is disposed on the flexible substrate 20, mechanical stress is applied to the combined layer 30 by bending the substrate 20 to have a radius of curvature, designated as "R", as shown in FIGS. 1B-C. The radius of curvature R may be created by outwardly bending (i.e., the ITO layer 10 is positioned on the outside, or positioned distal to the radius of curvature R) the combined layer 30 upon itself, as shown in FIG. 1B. Such outward bending can be achieved by outwardly bending the combined layer 30 around a substantially cylindrical section 32, such as a rod, which forms the radius of curvature R. Thus, when the combined layer 30 is bent outwardly, the combined layer 30 extends around the radius of curvature R by a predetermined amount, such as about 180 degrees, as shown in FIG. 1B, to form a plurality of first or initial dielectric lines (dielectric crack lines) 40, as shown in FIGS. 2A-B. It should be appreciated that the initial dielectric lines 40 are defined as regions in which gaps/voids or partial gaps in the conductive film 10 are formed, which act as a dielectric or electrical insulator. It should be appreciated that a pair of consecutive dielectric crack lines 40 formed in the ITO film 10 separate adjacent/neighboring conductive strips 50, which form electrically conductive electrodes. As such, the dielectric lines 40 serve to electrically isolate adjacent conductive strips or electrodes 50 formed between a pair of consecutive dielectric lines 40 from other electrodes 50.

Figure 3A:
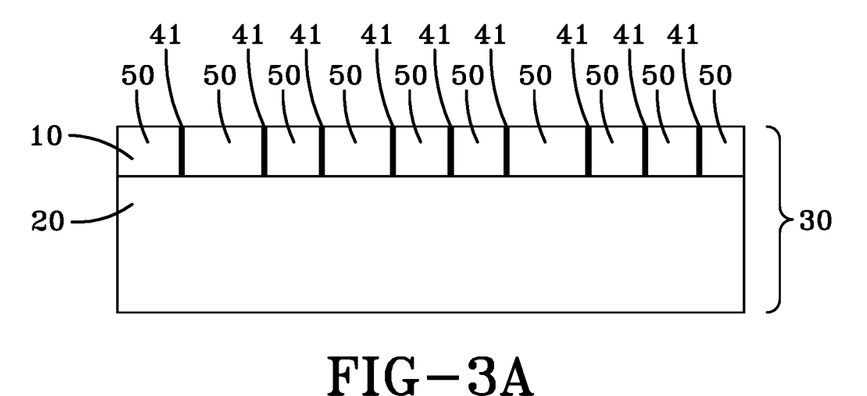
FIG. 3A is an elevational view showing improved or enhanced dielectric crack lines that are formed in the ITO film after the combined PET/ITO layer has been bent inwardly (i.e. inversely) in accordance with the concepts of the present invention.
Figure 3B:
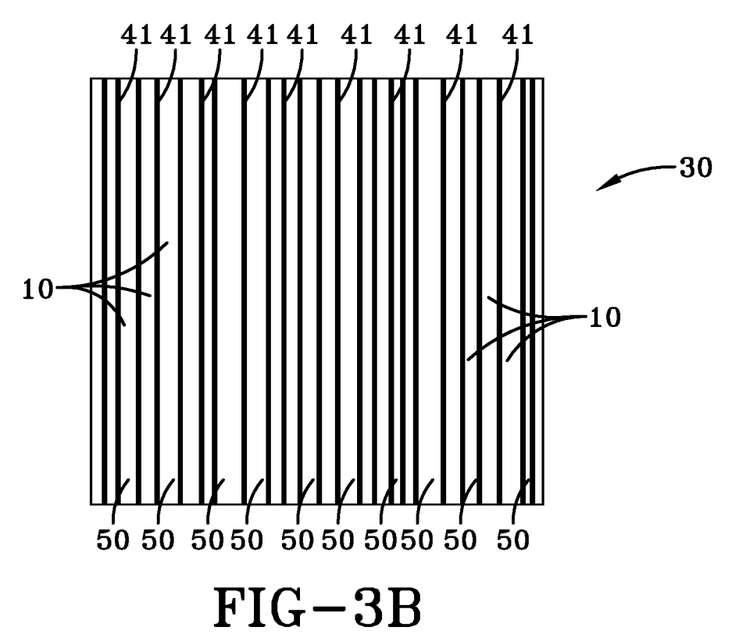
FIG. 3B is a schematic representation of a transmission optical microscope image of the combined PET/ITO layer that shows the improved dielectric crack lines formed in the ITO film in accordance with the concepts of the present invention.

In addition, to outwardly bending the combined layer 30, the combined layer 30 may be inwardly (i.e. inversely) bent (i.e., the ITO layer 10 is positioned on the inside or positioned proximate to the radius of curvature R) around the radius of curvature R by a predetermined amount, such as about 180 degrees for example, as shown in FIG. 1C. Such inward bending of the combined layer 30 serves to improve or enhance the dielectric performance (i.e. dielectric strength) and the electrical isolation properties of the initial dielectric lines 40 by further cracking the initial dielectric lines 40, so that improved or enhanced dielectric lines 41 are formed in the ITO film 10, as shown in FIGS. 3A-B. That is, the stress imparted by bending the conductive ITO film 10 in two directions, outwardly and inwardly, forms a plurality of uniformly spaced, enhanced dielectric lines 41 in ITO film 10, as shown in FIGS. 3A-B. The improved dielectric crack lines 41 are formed in the ITO film 10 as lines that extend in a direction that is substantially perpendicular to the direction in which the combined layer 30 is being bent with the radius R. That is, the dielectric lines 40,41 that are formed extend in the same direction as the axis from which the radius of curvature R extends. In one aspect, the dielectric lines 40,41 that are formed may extend in a direction so as to be substantially parallel to the axis from which the radius of curvature R extends. In addition, the spaced dielectric crack lines 41 define substantially uniform conductive strips or sections 50 therebetween in the ITO film 10. It should be appreciated that the dielectric crack lines 41 space apart adjacent conductive sections 50, and electrically isolate adjacent conductive strips or sections 50 from each other, allowing the conductive sections 50 to serve as electrically-conductive electrodes. It should also be appreciated that while all the first or initial dielectric crack lines 40 in FIGS. 2A-B are shown as being formed into improved or enhanced dielectric crack lines 41 in FIGS. 3A-B, the process discussed herein may also be carried out so that none, or only a portion, of the initial dielectric crack lines 40 are formed into improved or enhanced dielectric crack lines 41. It should also be appreciated in alternative embodiments, that the enhanced dielectric crack lines 41 may be formed in the ITO layer 10 by first inwardly bending the combined layer 30, then outwardly bending the combined layer 30.

Continuing with reference to FIGS. 1A-C, the stress imparted by the mechanical bending of the combined layer 30, previously discussed, may be calculated in accordance with the following approach. It should be appreciated that the thickness of the conductive film or layer 10 is generally thinner than the thickness of the substrate 20, and in some embodiments several orders of magnitude thinner. For example, the ITO layer or film 10 may have a thickness that is on the order of about 0.1 microns, while the thickness of the substrate 20 may be on the order of about 100-200 microns. As such, the thickness of the conductive film 10 is disregarded when calculating the stress applied to the combined layer 30, as presented below. Specifically, with regard to FIG. 1B, in the case where the substrate 20 is formed of PET (polyethylene terephthalate) and is outwardly bent by 180 degrees around the curved section 32 having a radius of curvature "R," the length of the inside surface of the substrate 20 that is adjacent to the radius of curvature R of the curved section 32 is equal to πR. The outside surface of the substrate 20 has a length that is longer than its inside surface, which allows the substrate 20 to accommodate the thickness, designated as "$T_1$", of the substrate film 20. In addition, the length of the substrate 20 is equal to $\pi T_1$, and the radius of curvature about which the substrate 20 is bent is increased to $R+T_1$, making the total length of the film $\pi(R+T_1)$. As such, the stress can be expressed as the relative increase in length of the substrate 20 that is required to accommodate the bend and is defined by equation:

$$\frac{\pi(R+T_1)-\pi R}{\pi R},$$

which simplifies to $T_1/R$. Thus, it is the ratio of the thickness of substrate 20 to the radius curvature R of the curved section 32 that is used to bend the combined layer 30 that defines the stress imparted to the combined layer 30, which causes the first dielectric crack lines 40 to form in the conductive ITO film 10. Then, the substrate 20, which is formed of PET, is inwardly bent by about 180 degrees around the curved section 32 having a radius of curvature designated as "R". Thus, the ratio of the thickness of substrate 20 to the radius of curvature R of the curved section 32 that is used to bend the combined layer 30 that defines the stress imparted to the combined layer 30, causes the formation of enhanced dielectric crack lines 41 in the conductive ITO film 10, as shown in FIGS. 3A-B, and thus results in the formation of enhanced cracked ITO electrodes.

In other words, as the flexible substrate 20 is outwardly bent around the radius of curvature R that is provided by the curved section 32, as shown in FIG. 1B, the outside surface of the substrate 20 elongates, and/or the inside surface of the substrate 20 contracts, by an amount defined by the radius of curvature R and the thickness of the substrate $T_1$, so as to accommodate the bend. The length of the outside surface of the substrate 20 exceeds the length of the inside surface of the substrate 20 about the bend by π times the thickness $T_1$ of the substrate 20, as shown in FIG. 1B. As such, the relative amount of stress induced by the bend is equal to the ratio of the thickness $T_1$ of the substrate 20 relative to the radius of curvature R, such as that provided by the curved section 32, that is being used to bend the combined layer 30. For example, in the case where the substrate 20 comprises PET having a thickness $T_1$ of about 7 mils or about 0.17 mm, and is tightly bent around a curved section 32 having a radius of curvature R of 1 mm, the % change in the length of the substrate 20 will be approximately 17%, which is sufficient to produce first or initial dielectric lines 40 in the ITO film 10, as shown in FIGS. 2A-B. Then, the flexible substrate 20 is inwardly bent around the radius of curvature R that is provided by the curved section 32, as shown in FIG. 1C, the inside surface of the substrate 20 is squeezed, or otherwise compressed, which is sufficient to form the enhanced dielectric lines 41 in the ITO film 10, as shown in FIGS. 3A-B. Therefore, because the enhanced dielectric crack lines 41, which are formed by bending the combined layer 30 in two directions are wider than first dielectric lines 40, which are formed by bending the combined layer 30 in one direction, the electrical isolation (i.e. resistance) between neighboring ITO electrodes 50 defined by the enhanced dielectric lines 41 is increased, thereby providing ITO electrodes 50 that have increased electrical isolation from one another.

Figure 4:
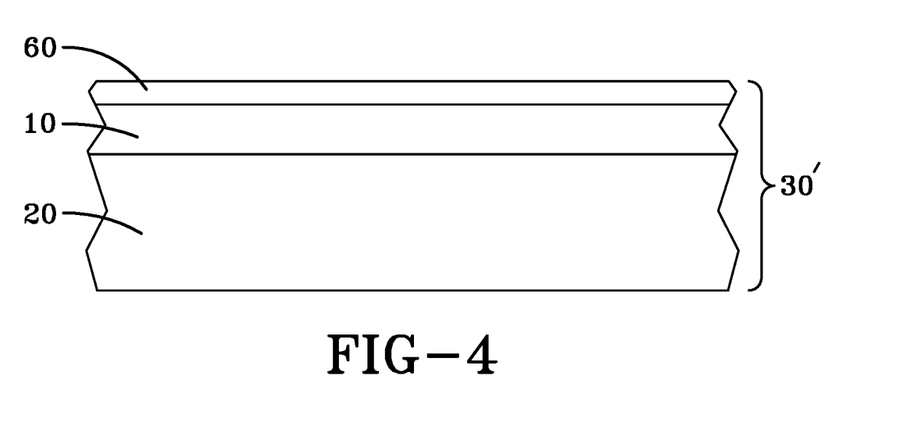
FIG. 4 is an elevational view of a combined PET/ITO/adhesive film layer in accordance with the concepts of the present invention.

First or initial dielectric crack lines 40 and enhanced dielectric crack lines 41 can be further enhanced or modified by applying an adhesive film or tape 60 to form a combined layer 30', as shown in FIG. 4. The adhesive tape 60 is applied onto the ITO film 10 with proper adhesion, whereby the adhesive tape 60 may comprise 3M Magic™ tape. Initially, in the same manner shown in FIG. 1B, the flexible substrate 20 is outwardly bent around the radius of curvature R that is provided by the curved section 32, such that the outside surface of the substrate 20 is stretched, which is sufficient to produce first dielectric lines 40 in the ITO film 10, as shown in FIGS. 2A-B. Next, the flexible substrate 20 is inwardly bent around the radius of curvature R that is provided by the curved section 32 in the same manner shown in FIG. 1C, so the inside surface of the substrate 20 is squeezed or otherwise compressed, which is sufficient to form enhanced dielectric lines 41 in the ITO film 10, as shown in FIGS. 3A-B. Finally, the adhesive tape 60 is removed from ITO film 10, whereupon any residual ITO flakes or particles that are generated from the formation of the dielectric lines 40,41 are removed, as the flakes are adhered to the adhesive tape 60. Without their removal, such ITO flakes would otherwise traverse the dielectric lines 40,41, decreasing the dielectric capability. Therefore, the dielectric crack lines 41 are further improved, because the electrical isolation along the direction, which is perpendicular to the direction of the conductive sections or electrodes 50, is increased due to the removal of the ITO flakes.

In another embodiment, first or initial dielectric crack lines 40 and enhanced dielectric crack lines 41 can be further enhanced by the application of force to the combined layer 30 at high temperature, as the PET substrate 20 is easily stretched at temperatures above the glass transition temperature. Thus, the flexible PET substrate 20 can be uniformly stretched by applying forces in the direction, which is perpendicular to the dielectric crack lines 40,41, while heating the combined layer 30,30' above the glass transition temperature. As such, the dielectric properties of the first dielectric crack lines 40 and enhanced dielectric crack lines 41 are improved by increasing their widths.

Thus, the first or initial dielectric crack lines 40 and the enhanced dielectric crack lines 41 formed in the conductive film 10 serve to disrupt or at least greatly reduce the electrical conductivity of the conductive film 10. As such, the dielectric crack lines 40 form spaces or gaps in the conductive film 10 that serve as dielectric regions that electrically isolate conductive sections or strips 50 of conductive film 10 that are positioned between a pair of dielectric lines 40,41. As such, the controlled cracking of the conductive ITO film 10 allows regular-spaced dielectric lines 40,41 to be formed that allow such a process to be used to form electrode patterns, such as a plurality of spaced electrodes 50, in the conductive film 10 of a precise shape and dimension.

Figure 5A:
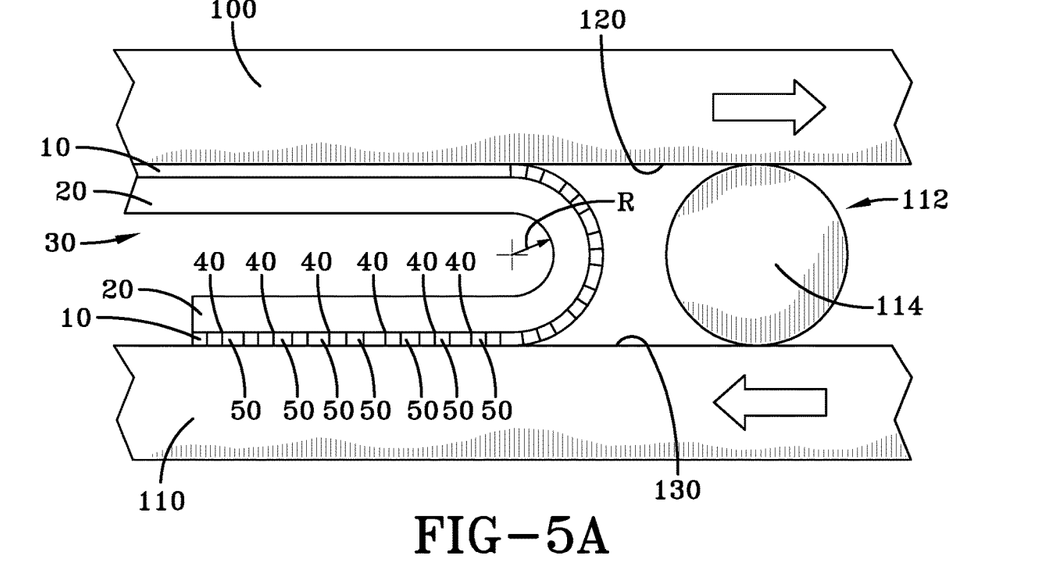
FIG. 5A is an elevational view showing the combined PET/ITO layer rolled between two flat glass plates that are separated at a predetermined distance, so as to be outwardly bent between the two flat glass plates to form first or initial dielectric crack lines in the ITO film in accordance with the concepts of the present invention.

In order to form the first dielectric crack lines 40 and the enhanced dielectric crack lines 41 along a length of the conductive ITO film 10 of the combined layer 30,30' a rolling process is utilized, whereby the radius of curvature R is moved along the length of the combined layer 30,30', such that the length of the ITO film 10 is subjected to the mechanical bending forces previously discussed. This process may be performed by positioning the combined layer 30 between two thick, opposed, flat glass plates 100 and 110 that are spaced apart by a gap 112 of a predetermined distance, as shown in FIG. 5A. It should be appreciated that the plates 100,110 may be formed from any suitable material, such as aluminum, for example. In one aspect, the plates 100 and 110 may be separated by a rolling spacer 114, such as a cylindrical rod or other rollable/moveable component, such as a roller, a ball bearing, or bead for example, to maintain the plates 100,110 in a substantially parallel arrangement, to define the radius of curvature R that is to be imparted to the combined layer 30, and to facilitate the rolling/sliding movement of the plates 100,110 relative to each other.

Thus, as a first step of the rolling process, the combined layer 30 is positioned, such that one end of the ITO film 10 is attached to an inner surface 120 of the glass plate 100, while the other end of the ITO film 10 is attached to an inner surface 130 of the other glass plate 110, so the flexible substrate 20 is outwardly bent around the radius of curvature R, as shown in FIG. 5A. Next, the combined layer 30 is rolled between the two plates 100,110, by moving the plates 100,110 in opposite directions, while the ITO film 10 and the substrate 20 are bent by an amount that is defined by the radius of curvature R that is determined by the size of the gap 112. However, in other embodiments, the rolling process may be carried out, whereby one plate 100,110 is fixed in a stationary position, while the other plate 100,110 is permitted to move. As such, the plates 100,110 are maintained in their substantially parallel orientation during the rolling process. In one aspect, the flexible substrate 20 is bent by about 180 degrees around the radius of curvature R in this configuration. As such, first dielectric lines 40 form in the ITO film 10 along the bend or along the axis of curvature R in order to accommodate the stretch stress that is imparted by the radius of curvature R defined by the gap 112.

Figure 5B:
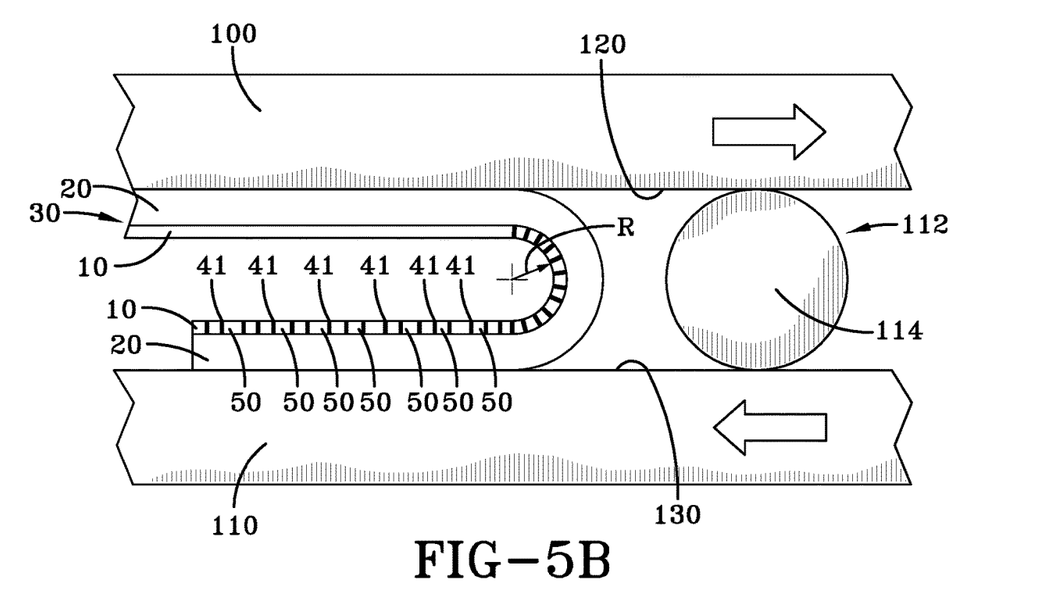
FIG. 5B is an elevational view showing the combined PET/ITO layer rolled between two flat glass plates that are separated at a predetermined distance, so as to be inwardly (i.e. inversely) rolled between the two flat glass plates to form improved or enhanced dielectric crack lines in the ITO film in accordance with the concepts of the present invention.

In a next step in the rolling process, the flexible substrate 20 is inwardly bent around the radius of curvature R, as shown in FIG. 5B, whereby the combined layer 30 is positioned, such that one end of the flexible substrate 20 is attached to an inner surface 120 of the glass plate 100, while the other end of the flexible substrate 20 is attached to an inner surface 130 of the other glass plate 110. Once the combined layer 30 is attached to the plates 100,110 the plates 100,110 are moved in the manner discussed above with regard to the formation of the first dielectric lines 40. As a result, enhanced dielectric crack lines 41 form in the ITO film 10 along the bend or along the axis of curvature R in order to accommodate the squeeze stress that is imparted by the radius of curvature R defined by the gap 112. It should be appreciated that each step of outward bending and inward bending performed by the rolling process may be performed one or more times. In other embodiments, the steps of the rolling process may be performed individually or together in any desired sequence.

Thus, uniformly rolling a polyester PET substrate 20 that is coated with a thin film of indium-tin-oxide (ITO) 10 inwardly and outwardly, as discussed above, forms a pair of neighboring/consecutive first dielectric lines 40 that are separated by about 5-10 microns, which results in the formation of an electrode 50 therebetween having the same dimension. In addition, such rolling process forms a pair of neighboring/consecutive enhanced dielectric lines 41 that are separated by about 15-30 microns, which results in the formation of an electrode 50 therebetween having the same dimension. The cracks in the ITO film 10 form as lines that are perpendicular to the bend direction. It should also be appreciated that the width of the dielectric crack lines 40,41 themselves may have a width on the order of about 0.05 microns for example.

In another embodiment, first dielectric lines 40 and enhanced dielectric lines 41 may be further enhanced by applying an adhesive film 60 and positioning the combined layer 30' between two thick, opposed, flat glass plates 100 and 110 that are spaced apart by a gap 112 of a predetermined distance, utilizing the same rolling technique discussed above with regard to FIGS. 5A-B. Specifically, the adhesive film or tape 60 having a suitable adhesive, such as 3M Magic™ tape, is applied upon the ITO film 10, as shown in FIG. 4, to form the combined layer 30'. Then, the combined layer 30' is positioned, such that one end of the adhesive tape 60 is attached to an inner surface 120 of the glass plate 100, while the other end of the adhesive tape 60 is attached to an inner surface 130 of the other glass plate 110, so the flexible substrate 20 is outwardly bent around the radius of curvature R, in a similar manner to that shown in of FIG. 5A. Next, the combined layer 30' is rolled between the two plates 100,110, whereby the ITO film 10 and the substrate 20 are bent by an amount defined by the radius of curvature R that is determined by the size of the gap 112. In one aspect, the flexible substrate 20 is bent by about 180 degrees in this configuration. As such, first dielectric crack lines 40 form in the ITO film 10 along the bend or along the axis of curvature R in order to accommodate the stretch stress that is imparted by the radius of curvature R defined by the gap 112. Next, the flexible substrate 20 is inwardly bent around the radius of curvature R, as shown in the third part of FIG. 3B, whereby the combined layer 30 is positioned, such that one end of the flexible substrate 20 is attached to an inner surface 120 of the glass plate 100, while the other end of the flexible substrate 20 is attached to an inner surface 130 of the other glass plate 110, in a similar manner to that shown in FIG. 5B. As such, enhanced dielectric crack lines 41 form in the ITO film 10 along the bend or along the axis of curvature R in order to accommodate the squeeze stress that is imparted by the radius of curvature R defined by the gap 112. Next, the adhesive tape 60 is removed from the ITO film 10, whereby the ITO flakes generated from the enhanced dielectric crack lines 41 are removed due to their adhesion to adhesive tape 60. Therefore, the first dielectric crack lines 40 and the enhanced dielectric crack lines 41 are further improved because the electrical isolation along the direction, which is perpendicular to the direction of the conductive sections or strips 50, are increased due to the removing of ITO flakes.

It should be appreciated that in other embodiments, Elmer's™ Glue, or any other suitable liquid adhesive, may also be used to remove the ITO flakes from the ITO film 10. This is because the Elmer's™ Glue can be coated on the surface of the ITO film 10 in the liquid state, whereby the ITO flakes are surrounded by Elmer's™ Glue during this liquid-coating process. Then, after the Elmer's™ Glue has dried, the dried glue can be removed as a dried film, which entraps or contains the ITO flakes or particles. As such, the ITO layer 20 is coated with the Elmer's™ Glue after the squeeze (i.e. inward bending) step of the rolling process discussed above. It should be appreciated that the Elmer's™ Glue process may be used with or without the process of using the adhesive tape 60.

Thus, in summary, one embodiment of the method contemplated by the present invention includes placing 3M Magic™ tape 60 upon the ITO layer 10 before rolling the combined layer 30'→stretch rolling (outward bending) the combined layer 30'→squeeze rolling (inward bending) the combined layer 30'→ and removing the 3M Magic™ tape 60 from the combined layer 30'. Another embodiment of the present invention includes stretch rolling (outward bending) the combined layer 30→placing 3M Magic™ tape on the ITO layer 10 to form the combined layer 30'→squeeze rolling (inward bending) the combined layer 30'→removing the 3M Magic™ tape from the combined layer 30'. Yet another embodiment of the present invention includes stretch rolling (outward bending) the combined layer 30→squeeze rolling (inward bending) the combined layer 30→placing the 3M Magic™ tape with the application of pressure or use Elmer's™ Glue on ITO layer 10 of the combined layer 30→removing the 3M Magic™ tape or Elmer's™ Glue from the combined layer 30; stretch rolling (outward bending) the combined layer 30→squeeze rolling (inward bending) the combined layer without the use of adhesive tape 60 or glue.

As previously discussed, to achieve a further improvement in the dielectric performance of the dielectric crack lines 40,41, the advantages of "3M Magic™ tape" and "Elmer's™ Glue" discussed herein may be combined, such that 3M Magic™ tape is placed on the ITO layer 10 before rolling of the combined layer 30'→stretch rolling (outward bending) the combined layer 30'→squeeze rolling (inward bending) the combined layer 30'→removing the 3M Magic™ tape from the combined layer 30'→coating the ITO film 10 with Elmer's™ Glue→blowing air from an air gun to dry the Elmer's™ Glue→removing the dried Elmer's™ Glue from the combined layer 30. This process removes additional, fine ITO flakes remaining on the surface of the ITO layer 10 that have not been removed by the 3M Magic™ tape 60.

Based on the foregoing, the advantages of the present invention are readily apparent. The main advantage of this invention is that a method of forming electrodes in a transparent, electrically conductive film, such as indium-tin-oxide (ITO) is carried out by the application of a bending force. Another advantage of the present invention is that a method of forming electrodes in a transparent, electrically conductive film, such as ITO, uses adhesive tape and/or glue to remove residual particles of the film that are generated as a bending force is applied thereto to form the electrodes to improve the electrical isolation of the electrodes.

Thus, it can be seen that the objects of the present invention have been satisfied by the structure and its method for use presented above. While in accordance with the Patent Statutes, only the best mode and preferred embodiment has been presented and described in detail, it is to be understood that the present invention is not limited thereto or thereby.

Accordingly, for an appreciation of the true scope and breadth of the invention, reference should be made to the following claims.

What is claimed is:

1. A method of patterning a film comprising the steps of:
providing a flexible substrate having an electrically conductive film disposed thereon to form a combined layer;
bending said combined layer about a radius of curvature to crack said electrically conductive film and form a plurality of dielectric lines in said electrically conductive film, such that each pair of consecutive dielectric lines defines and electrically isolates a conductive electrode therebetween;
heating said combined layer;
stretching said combined layer in a direction perpendicular to said plurality of dielectric lines;
applying a liquid adhesive layer to said electrically conductive film;
drying said liquid adhesive layer to form a dried film; and
removing said dried film from said electrically conductive film to remove one or more fragments of said electrically conductive film therefrom.

2. The method of claim 1, wherein said electrically conductive film is at least partially transparent.

3. The method of claim 1, wherein said electrically conductive film comprises indium-tin-oxide (ITO).

4. The method of claim 1, wherein said flexible substrate comprises polyethylene terephthalate (PET).

5. The method of claim 1, wherein during said bending step, said flexible substrate is adjacent to said radius of curvature as said combined layer is bent.

6. The method of claim 5, further comprising:
moving said radius of curvature along said combined layer to form said plurality of dielectric lines along a length of said electrically conductive film.

7. The method of claim 1, wherein during said bending step, said electrically conductive film is adjacent to said radius of curvature as said combined layer is bent.

8. The method of claim 7, further comprising:
moving said radius of curvature along said combined layer to form said plurality of dielectric lines along a length of said electrically conductive film.

9. The method of claim 1, wherein said bending step comprises:
placing said flexible substrate adjacent to said radius of curvature; bending said combined layer;
moving said radius of curvature along said combined layer to form said plurality of dielectric lines along a length of said electrically conductive film;
placing said electrically conductive layer adjacent to said radius of curvature;
bending said combined layer; and
moving said radius of curvature along said combined layer to form said plurality of dielectric lines along a length of said electrically conductive film.

* * * * *

UNITED STATES PATENT AND TRADEMARK OFFICE
CERTIFICATE OF CORRECTION

PATENT NO. : 10,828,797 B2
APPLICATION NO. : 15/109191
DATED : November 10, 2020
INVENTOR(S) : John West, Da-Wei Lee and Anders Olson It is certified that error appears in the above-identified patent and that said Letters Patent is hereby corrected as shown below:

On the Title Page

Item [73], delete "KENTA STATE UNIVERSITY" and insert --KENT STATE UNIVERSITY--.

Signed and Sealed this
Twenty-ninth Day of December, 2020

Andrei Iancu
*Director of the United States Patent and Trademark Office*